United States Patent [19]

Petrina

[11] 4,393,435
[45] Jul. 12, 1983

[54] REPAIRABLE FLUORESCENT LAMP BALLAST

[75] Inventor: Robert J. Petrina, Anaheim, Calif.

[73] Assignee: Bruce Industries, Inc., Gardena, Calif.

[21] Appl. No.: 170,899

[22] Filed: Jul. 21, 1980

[51] Int. Cl.³ .............................................. H05K 7/20
[52] U.S. Cl. .................................. 361/377; 361/386; 174/DIG. 2
[58] Field of Search ............... 361/331, 334, 356, 377, 361/379, 380, 381, 386, 387–389, 395, 399, 400, 401, 420, 429; 174/DIG. 2, 16 HS; 336/61, 90, 229

[56] References Cited

U.S. PATENT DOCUMENTS 3,087,132  4/1963  Snowdon ............................... 336/61
3,646,401  2/1972  Freegard ............................. 361/377
4,144,555  3/1979  McGalliard ......................... 361/401
4,222,089  9/1980  MacAskill, Jr. ..................... 361/399

Primary Examiner—G. P. Tolin
Attorney, Agent, or Firm—Ralf H. Siegemund

[57] ABSTRACT

A ballast coil, transformer, and power factor capacitor are plug-in mounted on a PC-board which is mounted into a frame being covered to provide a complete, unpotted enclosure. The transformer and the coil are additionally fastened to the enclosure and the board, and additional heat dissipation is provided for. Several different examples are enclosed for toroidal and laminated core structures and different capacitor positions. The capacitor is retained additionally by a strap which is screwed to one or both of the inductive elements. Additional fastening and heat dissipation is combined in toroidal inductances, by using a central post traversing the board and screw, and being fastened to a cover wall.

14 Claims, 7 Drawing Figures

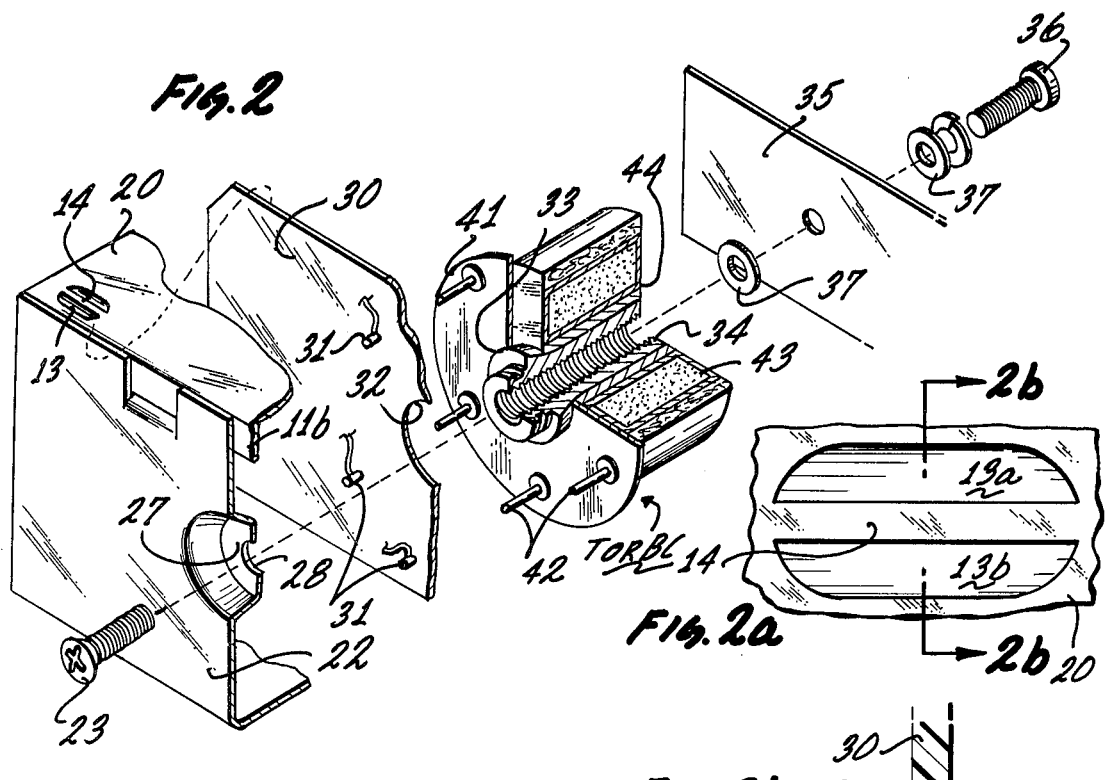
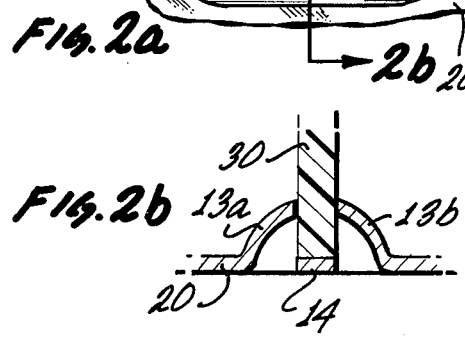
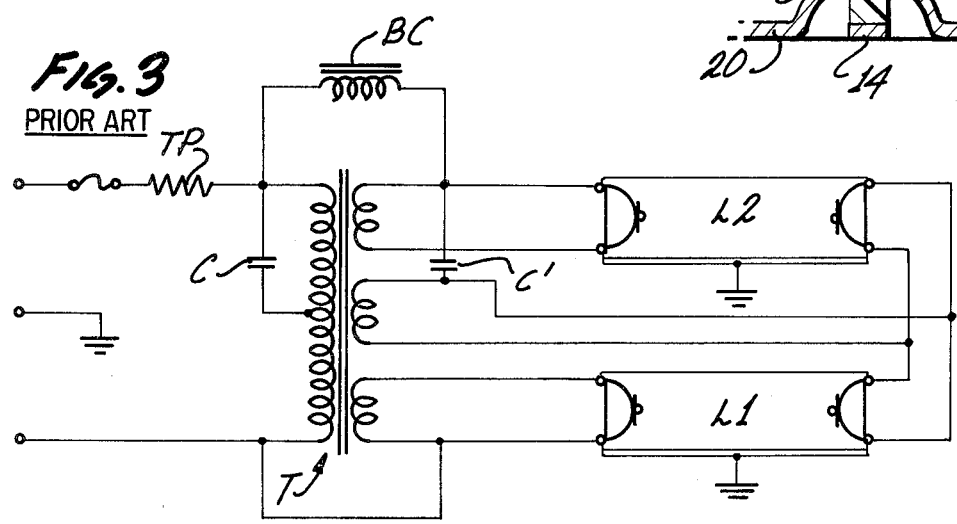

REPAIRABLE FLUORESCENT LAMP BALLAST

BACKGROUND OF THE INVENTION

The present invention relates to a repairable ballast for fluorescent lights, but offers, in fact, wider possibilities as to application and use.

The ballast element for fluorescent lighting includes usually a ballast coil proper, a step-up transformer, a power factor capacitor or capacitors, and, possibly, other auxiliary elements, all mounted and assembled in a module-type, unitary configuration. Such ballast elements are, of course, used wherever fluorescent lamps are being used. In most instances (i.e., household use), special precautions are not needed. The situation is different for lighting of vehicles and aircraft. Circuit integrity requires extensive shock-proofing and, of course, consistent heat dissipation. Accordingly, a ballast, as defined and to be used in an aircraft lighting system, has been potted. This practice has proven to be consistently successful. The circuit elements are well protected; they will not vibrate, so that circuit connections do not break. Also, heat dissipation is quite adequate through the potting material. However, potting adds considerable weight; and weight is always a problem in aircraft equipment. Moreover, a potted ballast is not repairable. This is, of course, true generally; a circuit element or assembly, once potted, is no longer accessible. Removal of the potting is inherently destructive. Thus, a potted ballast which has failed because of a defect of one element or even because of one connection has to be replaced in its entirety; it is not repairable. Repairability requires access, but ease of access must not compromise shock-proofing. Apparently then, shock-proofing and repairability are opposing constraints; they appear to be mutually exclusive.

DESCRIPTION OF THE INVENTION

It is an object of the present invention to provide a new and improved construction for mounting the elements of a ballast for fluorescent lighting, particularly for aircraft, without potting, to render the ballast repairable.

In accordance with the preferred embodiment of the present invention, a two-part enclosure is suggested, one part being a housing-type frame, the other one being a cover which, together with the frame, forms a complete enclosure. A printed circuit board is releasably mounted to the frame, e.g. by means of edge slots, and elements of a comparatively high failure probability are mounted to the board in a simple, plug-in type fashion; these elements include the transformer, the ballast coil, and the power factor capacitor. The transformer and the ballast coil are additionally screwed (i.e., releasably fastened) to the enclosure or the PC-board, or both; and the capacitor or capacitors are additionally retained by means of a retainer plate which is screwed to one or both of the inductive elements. The inductive elements are in broad surface contact with a heat-conductive element which, in turn, is in good heat-conductive, surface-to-surface contact with a metal surface of the enclosure for enhancing heat dissipation.

If the inductive elements are of toroidal construction and configuration, as is preferred, the additional fastening and heat-conductive functions are largely combined. The respective toroidal element is provided with a central post having a head which traverses the printed circuit board and makes good heat-conductive contact with a side wall of the cover. In addition, the post is bolted or screwed to that side wall to, thereby, fasten the toroidal element additionally.

It is, therefore, another object of the present invention to provide a new and improved shock-proof mounting, fastening and heat-dissipating structure for toroidal-inductive elements.

The inductive ballast elements may be of a laminated, core-type construction; and the fastening and heat-dissipating functions are separated. These inductive elements are screwed to the PC-board, while a suitably oriented flat core surface is in contact with a thermopad on an inside surface of the cover.

It is, therefore, another object of the present invention to provide a new and improved shock-proof mounting, fastening, and heat-dissipating structure for laminated core-type inductive elements.

The preferred embodiment of the invention, the objects and features of the invention, and further objects, features and advantages thereof, will be better understood from the following description taken in connection with the accompanying drawings.

DESCRIPTION OF THE DRAWINGS

FIG. 2 is an exploded view, particularly in cut-open section, of a portion of the ballast shown in FIG. 1, but as seen from a different angle;

FIG. 2a shows in detail the slot mounting feature of a printed circuit board in the ballast;

FIG. 2b is a section taken along lines 2b—2b in FIG. 2a;

FIG. 3 is a circuit diagram for the elements mounted as shown in FIGS. 1, 2, and others;

Proceeding now to the detailed description of the drawings, FIG. 1 illustrates a two-piece enclosure, being composed of a case or housing 10 and a cover 20, both being made made of an aluminum alloy. Housing 10 is a wide, U-shaped configuration, having a top 11 and sides 12a and 12b. The top 11 has longitudinal flange portions such as 11c, to be received between sides 21 or 22 of cover 20, and lugs 24 thereof, in a clamping-type connection. The housing and the cover have additionally overlaying flanges for mounting the ballast.

Figure 1:
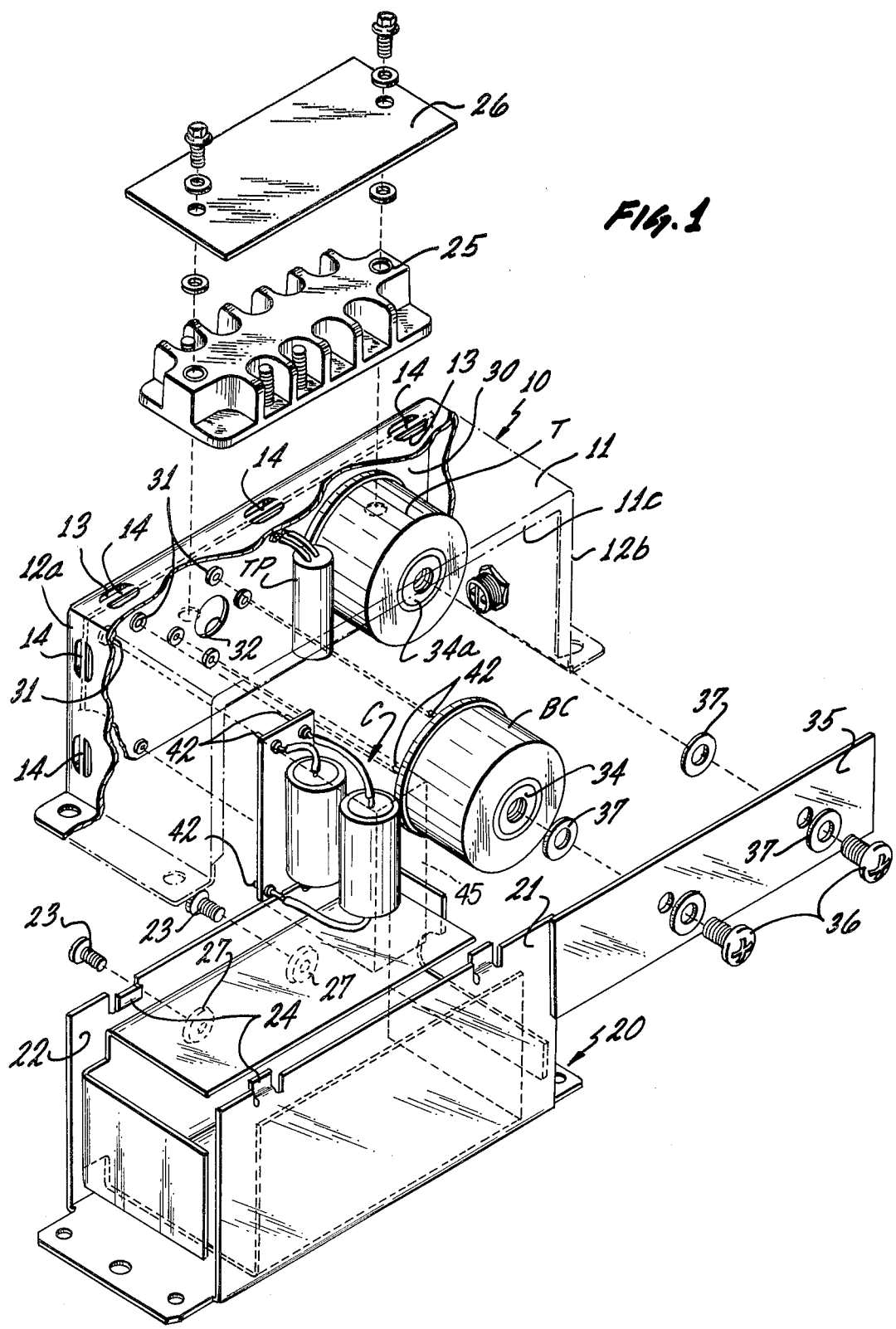
FIG. 1 is an exploded view of an example of a ballast in accordance with the preferred embodiment of the invention, illustrating the best mode of practicing same.

One of the open sides of housing or frame 10 is covered and, in a sense, closed by a printed circuit board 30. This board is releasably fastened to formed slots 13 of housing 10. The slot mounting is shown in greater detail in FIGS. 2a and 2b. Such a slot 13 is defined by two symmetrically arranged detents or ears 13a and 13b, leaving a bar 14 in between. The board 30 is clamped between these ears 13a, 13b, and its edge sits on bar 14.

The board (30) is slot-fastened in that manner to the frame at, for example, eight or more points. One should have at least four fastening points to ensure shock- and vibration-resistant mounting. The board carries the requisite circuit connections among the various circuit elements mounted and to be mounted on the board. The board may have a urethane coating on the side carrying the circuit etchings for protecting the circuit against various environmental conditions. This coating is semi-hard, and it adds to the thickness of the board so that it will be held tightly in the narrower slots between the various ears 13a and 13b. The circuit elements mounted on the board and projecting into the interior of the enclosure include a transformer T; a ballast coil BC; a two-capacitor, power-factor capacitor assembly C; and a thermal protector TP.

FIG. 3 shows representatively the connection between these circuit elements. The circuit is, of course, a conventional one and does not require elaboration. The diagram of FIG. 3 shows additionally how two lamps L1 and L2 are connected in circuit with the ballast. It should be noted that the ballast can be used with one, two, or more lamps, only the circuit pattern on the board 30 will differ; and the power factor capacitor rating will also be different.

The thermal protector TP, the wiring proper, and a small ceramic capacitor C' (needed only in the case of a dual lamp configuration) are soldered to the board. That is to say, the components with low or negligable failure probability are soldered, i.e., permanently connected, to the board. This is merely convenient, but not essential. If desired, they could be provided for easy removal, i.e., in a plug-in-type mounting as are the mayor components.

The major components of the ballast, transformer T, coil BC, and capacitor assembly C are mounted on board 30 in a plug-in-type configuration. Accordingly, the board 30 carries patterns of connector sockets or jacks 31, there being four sockets for capacitors C, four sockets for balast coil BC, and eight or more sockets, as required, for transformer T. These three major elements are, thus, mounted to housing 10 by being plugged into the PC-board which, in turn, is retained in the housing by slots 13. Elements T, BC, and C have appropriate pins 42 for plug-in fastening. Pins 42 are preferably gold-plated eyelets into which wires have been threaded and soldered. The sockets 31 have beryllium copper spring contacts, to obtain low contact resistance. These sockets are, in turn, also soldered to the circuit board. The pin and socket configuration should be coded in the sense that plug-in is possible only in the permissible position so that proper connection is, indeed, established just plugging the parts into the sockets in the only orientation possible. Mounting and support of these circuit elements on board 30 is, however, not limited to plug-in; they are fastened and retained by additional means which establish a heat sink, as will be described next.

The board, 30, has, additionally, two openings 32; only one is visible in FIG. 1, the other one is hidden by the transformer, being shown in mounted position. The openings are, each, provided to receive and be traversed by a collar or head 33 of a thermal post 34. There are accordingly two such posts; one (34) for coil BC, the other one (34a) for transformer T. The stem portion of each post merges into a flared portion; and the collar or head has a slightly smaller diameter than the widest flare.

The transformer and the ballast coil have each a carrier or header 41 from which pins 42 extend for plug-in into jacks 31. Toroidal coil-core configurations 43 for each of the inductive elements are cemented to their respective header 41. The coil-and-core configuration for the transformer and the respective assembly for the ballast coil are each by and in themselves potted in that the coil or coils are varnish-impregnated to the core. Moreover, the respective post, 34, or 34a, is potted into the toroid, by means of thermally conductive epoxy 44, shown for post 34 in greater detail in FIG. 2.

The posts 34 and 34a are, for example, made of an aluminum alloy to be relatively inexpensive; but such a material has a very good thermal conductivity. Broadly speaking, each post, 34 or 34a, is in broad cylindrical, surface-to-surface thermal contact with the respective toroidal assembly it traverses, the epoxy providing for a good thermal conductance in addition to securing fastening.

The head 33 of each post projects beyond its respective header 41. As the respective inductive element is plugged into board 30, head 33 projects through the respective opening 32; but the flared part of the stem abuts the board. The head 33 is longer than the board 30 is thick so that the head projects beyond the other side of the board. Moreover, head 33 has an annular groove to receive a snap ring (not shown) in order to clamp the head against the board as the other side of the board engages the flared part of the post's stem.

As the cover 20 is slipped onto housing 10, the wall 22 of the cover will abut the axial end of head 33. Wall 22 has inwardly extending dimples 27, each having a small, central opening 28, which will register with the threaded interior of the collar-post element; and a screw 23 will now permit bolting of the head and post directly to side wall 22.

The outer surface of head 33 should be in good conductive relation with the aluminum of cover wall 22. Preferably, a thermally conductive grease or paste is interposed. Alternatively, one may use a washer made of silicone fiberglass and amenable to intimate, somewhat plyable contact with head 33 and cover wall 22.

It can thus be seen that a thermal conductive path is established, extending from the interior of the coil or transformer through its respective post and to side wall 22 which will serve as a heat sink in its entirety. The temperature gradient through the post is quite low so that the temperature of the respective element is made to remain low through ample heat dissipation. Moreover, the two inductive elements are mounted by these posts, additionally and directly, to cover 20; in addition, that is, to being plugged into the PC-board which is mounted to frame 10. Thus, the inductive elements are, in fact, independantly mounted to the frame and to the cover of the enclosure; and the latter connection includes a heat sink configuration.

The two posts, 34 and 34a, serve also as mounting elements for a retainer plate 35. This insulating plate is fastened to both posts by means of screws 36, there being nylon washers 37 interposed. Plate 35 thus interconnects the two inductive elements on the other side and, thereby, uses each one for the retention and positioning of the other one. Retainer plate 35 must be made of magnetic and electrically insulating material to avoid inductive coupling of the coil and of the transformer. In addition, actually primarily, plate 35 serves as a retainer for capacitors C.

The capacitors C are mounted in a box 45 from which project the four requisite pins 42. Plate 35, when fastened to posts 34 and 34a, engages capacitor box 45 from the rear and holds it in place. It should be noted that the screws by means of which plate 35 is mounted to the thermal posts 34 and 34a, may actually traverse bores in side wall 21 of cover 20. This way, one could anchor the posts and, thereby, both elements T and BC to both side walls of the cover. Not only would this add side 21 to the heat sink, but mounting stability would be enhanced. Practice, however, has shown this to be unnecessary. Side 22 suffices as a heat sink; so does the cantilever mounting combined with retainer plate 35 on the other ends. Moreover, specific care has to be taken that the respective post and cover 20 do not establish a short-circuit-type, single-loop winding. Thus, the screws 36 and the washers 37, used here, would have to be of insulating material.

A terminal block 25 is mounted on top of case 10 (top 11) and is provided with a cover plate 26. Suitable wires are strung from the PC-board to the contacts of the terminal. External connections can also be accommodated with other suitable connectors or external lead wires.

It can readily be seen that the ballast elements are not potted, but are mounted in a manner which combines shock-proof mounting with adequate heat dissipation. Furthermore, the elements most likely to fail and to be replaced are all plug-in elements with easy-to-remove retaining means. It is merely necessary to unscrew the screws 23 and slip cover 20 off housing 10. After removal of scrws 36, elements C, BC, and/or T are, now, simply unplugged for replacement, repair, or other maintenance purposes; e.g., simple testing. The PC-board can be removed from frame 10 if that facilitates the repair.

Figure 4:
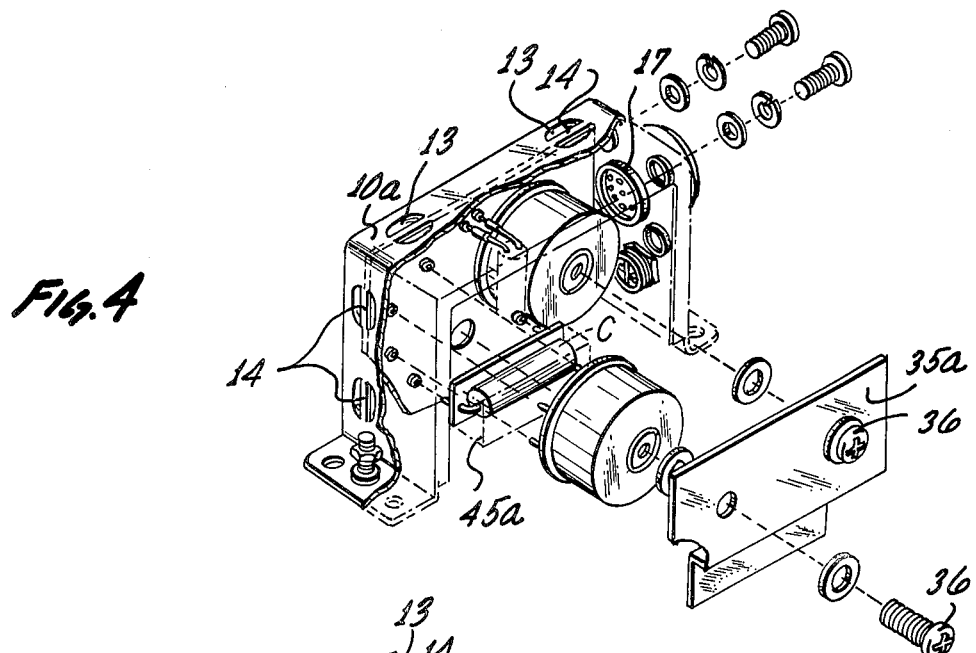
FIG. 4 is an exploded view of a modified portion of FIG. 1, FIGS. 1, 2, and 4 showing toroidal-inductive elements.

FIG. 4 illustrates a modification without departure from the principles involved. Capacitor C, in this case, is mounted in an elongated box 45a underneath the transformer and the ballast coil. Accordingly, a modified retention plate 35a is used; but this plate still interconnects the two posts 34 and 34a. Moreover, instead of a terminal block, a connection socket 17 is mounted to one of the sides of the somewhat smaller housing 10a. This figure, therefore demonstrates that the invention is not tied to a particular geometric pattern of the assembly.

Figure 5:
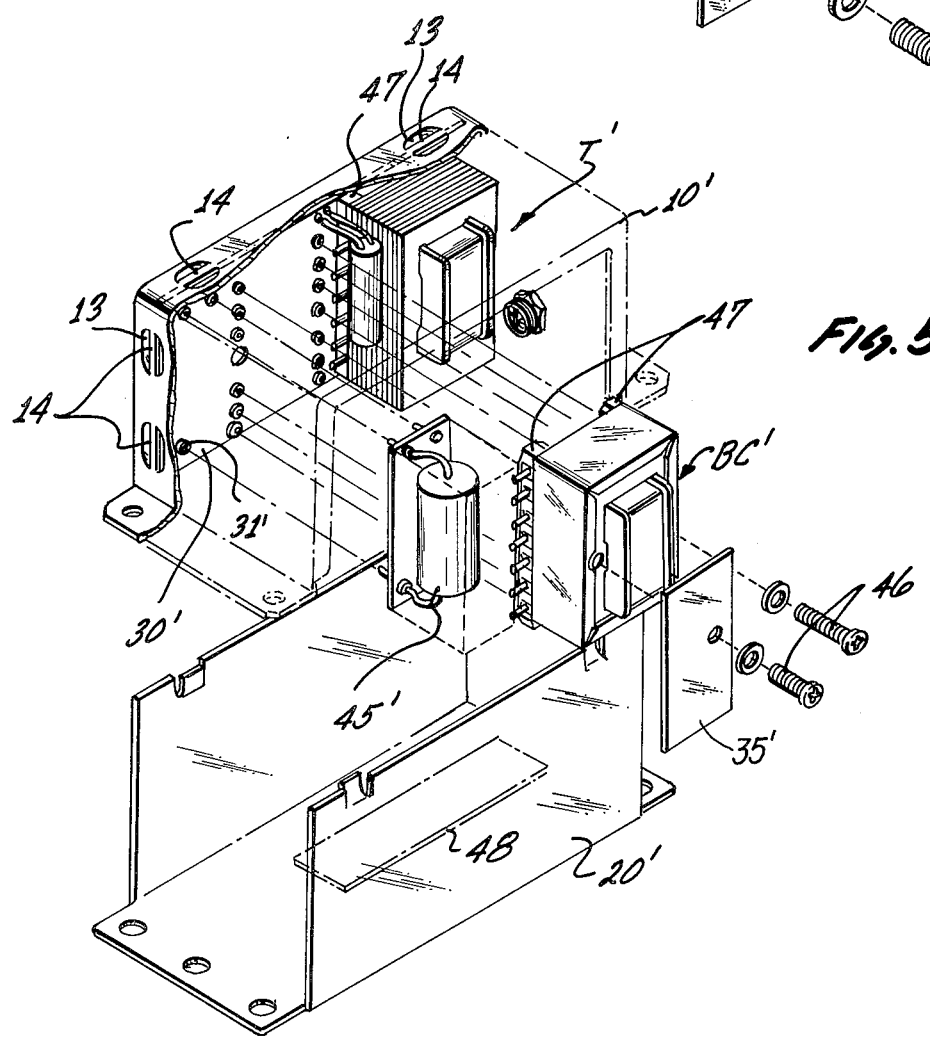
FIG. 5 is an exploded view of another modified version of such a ballast, showing laminated core-type inductances.

FIG. 5 presents a further modification, demonstrating applicability of the basic concept to different types of ballast elements. The ballast is composed here of a laminated core-type transformer T' and a correspondingly laminated core-type ballast coil BC'. This particular ballast includes again a housing or frame 10', being substantially similar to housing 10. A cover 20' is provided and differs from cover 20 of FIG. 1 in that the side walls of cover 20' do not have apertures.

A printed circuit board 30' is mounted to housing 10', by insertion into slots 13' thereof. This board is provided with two sets of two rows each of terminal plugs or jacks 31' for insertion of pins pertaining to and projecting from the inductive elements T' and BC'. The two elements are provided with terminal bars 47 from which the pins project and by means of which the elements sit on PC-board 30'.

Each of the inductive elements is additionally secured to the PC-board by a pair of screws 46, threaded into corresponding inserts in board 30'. In this way, fasting of the elements is supplemented and does not depend upon plug-in alone.

Due to the different configurations of these laminated core-type elements, heat dissipation is provided for differently. The rectangular configuration of the cores establishes inherently several flat sides. Thus, one side of each of the elements T' and BC' is brought into intimate, heat-conductive contact with a thermal pad 48, made of silicon fibers and being disposed on the inside bottom of cover 20'. The pad is wide enough to contact both elements, T' and B', provided these elements are properly fastened to the PC-board, and the cover is firmly slipped into place. One could use two pads, one for each of the inductive elements; but a single pad is clearly simpler. Pads could also be interposed on opposite sides to make thermal contact with the housing surface 10 for additional thermal dissipation.

In addition, one of the inductive elements, which in the illustrated case is coil BC', carries a retainer plate 35'. This plate is screwed to the coil structure BC' by one of the screws 46 and extends over box 45' which contains the capacitor and is being held in place therewith. The box is, of course, also plugged-in to the PC-board.

The invention is not limited to the embodiments described above; but all changes and modifications thereof, not constituting departures from the spirit and scope of the invention, are intended to be included.

I claim:

1. A repairable ballast for fluorescent lamps, the ballast including at least one transformer, ballast coil means and capacitor means, and a support and mounting structure, comprising:
   a metal, frame-like housing;
   a metal cover on the housing and defining therewith a complete enclosure;
   a printed circuit board having a plurality of sockets, the transformer, the coil means, and the capacitor means being provided with pins and being removably inserted respectively in the sockets of the plurality, the circuit board being mounted to the housing, becoming thereby part of said enclosure;
   threaded means for additionally releasably securing the transformer and the coil means to the enclosure;
   supplemental releasable means disposed for holding the capacitor means in place;
   thermal conduction means in physical engagement with the coil means and the transformer, and in physical and releasable engagement with the surface portion of a metallic part of the enclosure; and
   the coil means, the capacitor means, and the transformer being directly removable upon release of the threaded means by unplugging them from the board, the enclosure not being filled with any potting material.

2. The structure as in claim 1, said supplemental means being a retainer plate, releasably secured to, at least, one of the transformer and the ballast coil.

3. The structure as in claim 1, said thermal conductor means being pad means, engaging the coil means, the transformer and the metal cover, the metal cover serving as a heat sink.

4. The structure as in claim 1, the transformer and the coil means being each of toroidal configuration, each having a cylindrical opening accordingly, the thermal conduction means and the fastening means including for each of the transformers and the coil means a thermally conductive post inserted into the cylindrical opening, and having a head screwed to the metal frame.

5. The structure as in claim 4, the printed circuit board having openings fully traversed by the heads.

6. The structure as in claim 4, the post having a flared portion for abutment against the board, there being means to engage the board from its respective other side.

7. The structure as in claim 3, the pad means being at least one silicone fiberglass pad.

8. The structure as in claim 4, there being a thermally conductive lubricant interposed between the head and the cover.

9. The structure as in claim 4, there being a silicone fiberglass washer interposed between the cover and the head.

10. In a mounting structure for a repairable ballast for fluorescent lamps, the combination comprising:
   a metal frame-like housing;
   a metal cover on the housing and for defining therewith a complete enclosure;
   a printed circuit board mounted on the housing and having an opening and plug-in-type sockets around the opening;
   at least one toroidal inductance means, having a central opening and being mounted on a header plate, and having pins plugged into the sockets of the printed circuit board;
   a metal post connected to the toroidal inductance means at the central opening thereof and in good, thermoconductive relationship with the inductance means, and having a projecting head traversing the opening in the board;
   means for releasably fastening the post head onto the metal cover, adjacent to the opening in the board so that the metal plate serves as a heat sink, and the inductance means is additionally fastened in position in relation to the board; and
   threaded means for additionally releasably securing the toroidal inductance means to the enclosure and opposite said post head.

11. In a structure as in claim 10, the metal plate being a part of a cover, the board being slot-mounted to a housing frame, the cover and the housing frame constituting an enclosure in which the inductance means is releasably retained without potting.

12. A repairable ballast for fluorescent lamps, the ballast including at least one transformer, ballast coil means and capacitor means, and a support and mounting structure, comprising:
   a metal, frame-like housing;
   A metal cover on the housing and for defining therewith a complete enclosure;
   a printed circuit board having a plurality of sockets, the transformer, coil means, and the capacitor means provided with pins and being removably inserted respectively in the sockets of the plurality, the circuit board being mounted to the housing, becoming thereby part of said enclosure;
   first and second thermal conductive means, respectively in separate engagement with the transformer and the coil means for dissipating heat into different locations of the walls of the enclosure;
   at least one of the transformer and the coil means being a toroidal element that includes a coil, a core means, and a header plate from which the pins project, which are inserted into sockets of the plurality of sockets, the element having a central opening, defined by a cylindrical wall, the thermal conductive means including a post of thermally conductive material bonded to a cylindrical wall of the element in the central opening to be in thermal conductive relationship with the coil and the core means, the element having a head projecting beyond the header plate, being surrounded by the pins and being in heat-conductive relation with the wall of the enclosure at one of the locations;
   means for releasably fastening the head to the enclosure; and
   threaded means for additionally releasably fastening the post to the enclosure on a side opposite said head.

13. The ballast as in claim 1 or 12, the metal housing having a plurality of pairs of ears leaving a bar of enclosure material in between, the bar being flush with adjacent portions of the enclosure, the board being inserted between the ears.

14. In a mounting structure as in claim 10, or 11, there being additional sockets on the board and another circuit element, the latter element being plugged into the additional sockets; and
   a retainer plate secured to the post and extending over the circuit element to hold it in position when both the inductance means and the circuit element are plugged into the board.

* * * * *